US011370005B2

(12) United States Patent
Moon et al.

(10) Patent No.: US 11,370,005 B2
(45) Date of Patent: Jun. 28, 2022

(54) NANO COMPOSITE STRUCTURE WITH NANO PATTERNED STRUCTURE ON ITS SURFACE AND METHOD OF PREPARING THE SAME (71) Applicant: KOREA INSTITUTE OF SCIENCE AND TECHNOLOGY, Seoul (KR)

(72) Inventors: Myoung Woon Moon, Seoul (KR); Heon Ju Lee, Seoul (KR); Tae Jun Ko, Seoul (KR); Kyu Hwan Oh, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 14/660,435

(22) Filed: Mar. 17, 2015

(65) Prior Publication Data
US 2015/0258588 A1  Sep. 17, 2015

(30) Foreign Application Priority Data

Mar. 17, 2014 (KR) .................. 10-2014-0031150
Apr. 7, 2014  (KR) .................. 10-2014-0041512

(51) Int. Cl.
B08B 17/06   (2006.01)
B01D 29/05   (2006.01)
(Continued)

(52) U.S. Cl.
CPC ........ B08B 17/065 (2013.01); B81C 1/00206 (2013.01); B81B 2207/056 (2013.01); Y10T 428/24479 (2015.01)

(58) Field of Classification Search
CPC .. B08B 17/065; B01D 29/0093; B01D 29/05; B81B 2207/056; B81C 1/00206; Y10T 428/24479
See application file for complete search history.

(56) References Cited

U.S. PATENT DOCUMENTS 9,096,705 B2   8/2015 Park et al.
9,409,771 B2   8/2016 Moon et al.
(Continued)

FOREIGN PATENT DOCUMENTS

JP         2005332638 A  * 12/2005
KR   10-2009-0011279 A    2/2009
(Continued)

OTHER PUBLICATIONS

Hofmann et al, "State of Transition Metal Catalysts During Carbon Nanotube Growth," Jan. 14, 2009.*
(Continued)

Primary Examiner — Maria V Ewald
Assistant Examiner — Ethan Weydemeyer
(74) Attorney, Agent, or Firm — Cantor Colburn LLP (57) ABSTRACT Provided are a method of producing a nano composite structure and a nano composite structure produced by using the same. The method comprises producing a substrate; placing a metal net structure above the substrate; and plasma treating the substrate above which the metal net structure is placed. The method allows a nano composite structure with a nano patterned structure on its overall surface to be easily produced. The nano composite structure includes a substrate having a plurality of first protrusions constituting a nano pattern on its surface; and an inorganic particle disposed on an end of at least a portion of the first protrusions.

18 Claims, 10 Drawing Sheets (51) Int. Cl.
*B01D 29/00* (2006.01)
*B81C 1/00* (2006.01)

(56) References Cited

U.S. PATENT DOCUMENTS

| | | | |
|---|---|---|---|
| 9,862,622 B2 | 1/2018 | Hwang et al. | |
| 2003/0185741 A1* | 10/2003 | Matyjaszewski | B82Y 10/00 |
| | | | 423/445 R |
| 2006/0159916 A1* | 7/2006 | Dubrow | B01J 20/28007 |
| | | | 428/357 |
| 2008/0098805 A1* | 5/2008 | Jin | B82Y 15/00 |
| | | | 73/105 |
| 2009/0143227 A1* | 6/2009 | Dubrow | B01D 39/083 |
| | | | 502/406 |
| 2010/0050871 A1 | 3/2010 | Moy et al. | |
| 2010/0249740 A1* | 9/2010 | Miyamoto | A61F 13/51104 |
| | | | 604/384 |
| 2010/0291461 A1* | 11/2010 | Ji | H01M 4/8807 |
| | | | 429/480 |
| 2011/0124941 A1 | 5/2011 | Verdegan et al. | |
| 2011/0286896 A1* | 11/2011 | Hess | D21H 21/16 |
| | | | 422/503 |
| 2012/0012523 A1* | 1/2012 | Canonico | B01D 39/083 |
| | | | 210/507 |
| 2012/0223011 A1 | 9/2012 | Moon et al. | |
| 2014/0011013 A1* | 1/2014 | Jin | H01L 31/02366 |
| | | | 428/297.4 |
| 2015/0162623 A1 | 6/2015 | Hong et al. | |

FOREIGN PATENT DOCUMENTS

| | | | | |
|---|---|---|---|---|
| KR | 10-2011-0106147 A | 9/2011 | | |
| KR | 10-2012-0100319 A | 9/2012 | | |
| KR | 10-2012-0122375 A | 11/2012 | | |
| KR | 10-2014-0002971 A | 1/2014 | | |
| WO | 2012088209 A2 | 6/2012 | | |
| WO | WO 2012087352 A2 * | 6/2012 | | B05D 5/08 |

OTHER PUBLICATIONS

Communications of Korean Office Action dated Aug. 9, 2016 of Korean Patent Application No. 10-2014-0041512, which corresponds to this application.
Shuchen Hsieh et al., Plasma induced patterning of polydimethylsiloxane surfaces, Materials Science and Engineering B, 2009, pp. 18-23, vol. 156, Elsevier.
Communications of Notice of Allowance dated Mar. 29, 2017 of Korean Patent Application No. 10-2014-0041513, which corresponds to this application.
European Office Action for EP Application No. 15159488.4 dated Jun. 7, 2021, citing the above reference(s).

* cited by examiner

FIG. 5 h = gap between mesh and substrate
d = diameter of mesh wire
s = gap between adjacent mesh wires

NANO COMPOSITE STRUCTURE WITH NANO PATTERNED STRUCTURE ON ITS SURFACE AND METHOD OF PREPARING THE SAME

CROSS-REFERENCE TO RELATED PATENT APPLICATIONS

This application claims the benefit of Korean Patent Application Nos. 10-2014-0041512, filed on Apr. 7, 2014, and 10-2014-0031150, filed on Mar. 17, 2014, in the Korean Intellectual Property Office, the disclosures of which are incorporated herein in their entirety by reference.

BACKGROUND OF THE INVENTION

1. Field of the Invention

Embodiments are directed to a nano composite structure with a nano patterned structure on its surface and a method of producing the same, and in particular, to a nano composite structure having a uniform nano patterned structure on its overall surface and a method of producing the same.

2. Description of the Related Art

Hydrophobicity is a property of a molecule having an absence of attraction for a mass of water. When a contact angle between a liquid and a solid plane exceeds 90°, it can be said that the solid plane has a low affinity to water and hydrophobicity. When the contact angle is less than 90°, it can be said that the solid plane has high affinity to water and hydrophilicity. Superhydrophobicity is a case in which a contact angle between a liquid and a solid plane is equal to or greater than 150°.

A superhydrophobic surface having the contact angle with respect to water of 150° or more has been getting much attention due to its importance in basic studies and actual application cases. Superhydrophobicity is a physical characteristic of a surface of an object that is hardly wet. For example, leaves of plants, wings of insects, or wings of birds have a characteristic that allows an external contaminating material to be removed without particular removing processes, and that protects them from any contamination in the first place. This is because these leaves and wings have superhydrophobicity.

Wettability is a major surface characteristic of a solid material, which is dependent on a chemical composition and a geometric micro/nano structure. Wettable surfaces have been getting much attention due to its potential use in various fields including oil-water separation, reflection prevention, bioadhesion prevention, adhesion prevention, contamination prevention, self-cleaning, and fluid turbulence inhibition.

Recently, most researchers have focused on the manufacture of biomimic superhydrophobicity surfaces due to a wide range of their potential use. In nature, leaves of many plants have water repellency and self-cleaning properties. Lotus leaves are known as a representative example of a naturally-occurring superhydrophobicity surface. Lotus leaves have a contact angle of about 161° with respect to water. Lotus leaves have a hierarchical micro and nano combination structure.

Meanwhile, as industries advance, environmental problems are heightened. Thus the research into separation and/or removing a particular material from a mixture, such as oil-water separation and desalination of sea water, is increasing continuously.

As a material for the oil-water separation, a material having superhydrophobicity and lyphophilicity properties may be used. For example, although a non-woven fabric has a lyphophilic characteristic and hydrophobic characteristics, its hydrophobic characteristic needs to be improved. Hydrophobicity of the non-woven fabric can be improved by forming a nano patterned structure on its surface. However, it is difficult to form a substantially uniform nano patterned structure in a large surface area.

SUMMARY OF THE INVENTION

An aspect of the embodiments provides a nano composite structure with a uniform nano patterned structure on its surface, and a method of producing the same.

Another aspect of the embodiments provides a nano composite structure that is produced by using the method.

According to one or more embodiments, a method of producing a nano composite structure comprises providing a substrate; placing a metal net structure above the substrate; and plasma treating the substrate above which the metal net structure is placed.

According to an embodiment, the substrate may include at least one selected from a plastic, a fiber, a glass, a metal, a ceramic, and a carbon-based material.

According to an embodiment, the plastic may include at least one selected from polypropylene, polyethylene terephthalate, polystyrene, polymethyl methacrylate, polyvinylidene fluoride, polytetrafluoroethylene, and a copolymer thereof.

According to an embodiment, the fiber may include natural fiber, synthetic fiber, or a combination thereof.

According to an embodiment, the carbon-based material may include at least one selected from graphite, carbon fiber, diamond, and graphene.

According to an embodiment, the metal net structure may be placed above the substrate with a gap of about 0 to about 10 mm.

According to an embodiment, the metal net structure may include at least one selected from Ti, Cu, Au, Ag, Cr, Pt, Fe, Al, Si, an alloy thereof, and an oxide thereof.

According to an embodiment, the metal net structure may include metal wires, wherein adjacent wires are spaced apart from each other with a gap of about 10 μm to about 500 μm.

According to an embodiment, the plasma treating may include depositing a metal or metal oxide particle generated from the metal net structure on the surface of the substrate through the plasma treatment; and etching residual portions other than portions on which the metal or metal oxide particles are deposited from the surface of the substrate through the plasma treatment.

According to an embodiment, the depositing and the etching may be simultaneously performed under the same plasma treatment conditions.

According to an embodiment, the plasma treating may be performed in the presence of at least one gas selected from $O_2$, $CF_4$, Ar, $N_2$, and $H_2$.

According to an embodiment, the plasma treating may be performed in a voltage range of about −100 V to about −1000 V, at a pressure of about 1 to about 1000 mTorr, for about 10 seconds to about 5 hours.

According to an embodiment, the metal net structure may include Ti, and the plasma treating is performed by using $O_2$ gas to provide superhydrophilicity to a surface of the nano composite structure.

According to an embodiment, the method may further includes removing the metal net structure and forming a hydrophobic thin film on a surface of the substrate after the plasma treating.

According to an embodiment, the hydrophobic thin film may include a fluorine thin film, a fluorine-containing carbonaceous thin film, an organic hydrogenation silicon thin film, or a combination thereof.

According to an embodiment, the hydrophobic thin film may include hexamethyldisiloxane.

According to one or more embodiments, a nano composite structure may be produced by using the method.

According to one or more embodiments, a nano composite structure includes a substrate comprising a plurality of first protrusions forming a nano pattern on at least one surface; and an inorganic particle disposed at an end of at least some portions of the first protrusions.

According to an embodiment, the substrate may include at least one selected from a plastic, a fiber, a glass, a metal, a ceramic, and a carbon-based material.

According to an embodiment, the plastic may include at least one selected from polypropylene, polyethylene terephthalate, polystyrene, polymethyl methacrylate, polyvinylidene fluoride, polytetrafluoroethylene, and a copolymer thereof.

According to an embodiment, the fiber may include a natural fiber, a synthetic fiber, or a combination thereof.

According to an embodiment, the carbon-based material may include at least one selected from graphite, carbon fiber, diamond, and graphene.

According to an embodiment, the metal may include at least one selected from iron (Fe), aluminum (Al), stainless steel, copper (Cu), platinum (Pt), gold (Au), silver (Ag), titanium (Ti), silicon (Si), and an alloy thereof.

According to an embodiment, the substrate may include a non-woven fabric.

According to an embodiment, each of the first protrusions may have a nano-hair shape, a nano fiber shape, a nano-pillar shape, a nano-rod shape, or a nano-wire shape.

According to an embodiment, each of the first protrusions may have a diameter of about 1 to about 100 nm, a length of about 1 to about 10,000 nm, and an aspect ratio of about 1 to about 100.

According to an embodiment, the inorganic particle may include Ti, Cu, Au, Ag, Cr, Pt, Fe, Al, Si, an alloy thereof, an oxide thereof, or a combination thereof.

According to an embodiment, the inorganic particle may include $TiO_2$.

According to an embodiment, the nano pattern may be repeatedly arranged at identical or different gaps.

According to an embodiment, the substrate may further include a second protrusion that does not form a nano pattern.

According to an embodiment, the inorganic particle may not be disposed at an end of the second protrusion.

According to an embodiment, the second protrusion may be formed in a mesh pattern.

According to an embodiment, a height of the second protrusion may be equal to or higher than a height of the first protrusion.

According to an embodiment, may further include a hydrophilic thin film coated on at least a portion of the surface of the substrate.

According to an embodiment, the hydrophobic thin film may include a fluorine thin film, a fluorine-containing carbonaceous thin film, an organic hydrogenation silicon thin film, or a combination thereof.

According to an embodiment, the hydrophobic thin film may include hexamethyldisiloxane.

BRIEF DESCRIPTION OF THE DRAWINGS

The above features and other features and advantages of the embodiments of the present invention will become more apparent by describing in detail exemplary embodiments thereof with reference to the attached drawings in which.

DETAILED DESCRIPTION OF THE INVENTION

Hereinafter, with reference to the attached drawings, a method of producing a nano composite structure according to an embodiment and a nano composite structure produced by using the same method will be described in detail.

An aspect provides a method of producing a nano composite structure including providing a substrate; placing a metal net structure above the substrate; and plasma treating the substrate above which the metal net structure is placed.

The method of producing a nano composite structure is not limited to the area or sectional shape of the substrate, and in particular, the method allows a nano composite structure having a uniform nano pattern on its overall surface to be formed in a continuous manner.

The term "nano composite structure" as used herein indicates a structure in which a nano patterned structure is formed on the surface of a substrate, and an inorganic material, such as a metal or a metal oxide, which may differ from a material for the substrate, is disposed at an end of a protrusion forming the nano patterned structure. Accordingly, the term "nano composite structure" includes a "nano" structure and a "composite material." A nano composite structure produced by using the method will be described in detail below. The term "aspect ratio" as used herein of a protrusion describes the proportional relationship between its length and its diameter.

Figure 1A:
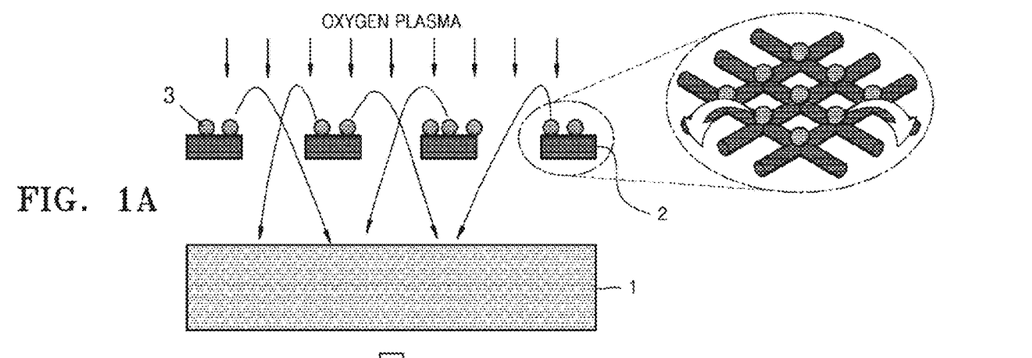
FIGS. 1A-1C illustrate a method of producing a nano composite structure according to a first embodiment.
Figure 1B:
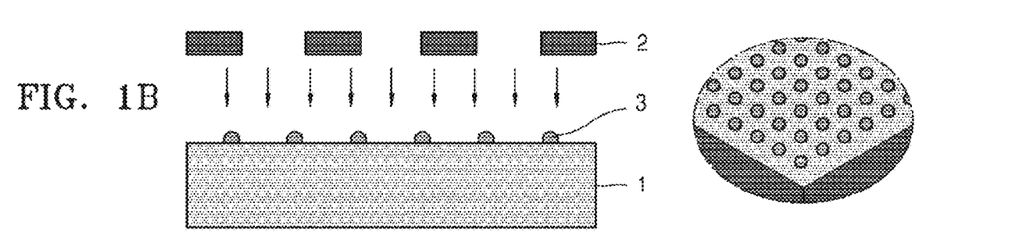
Figure 1C:
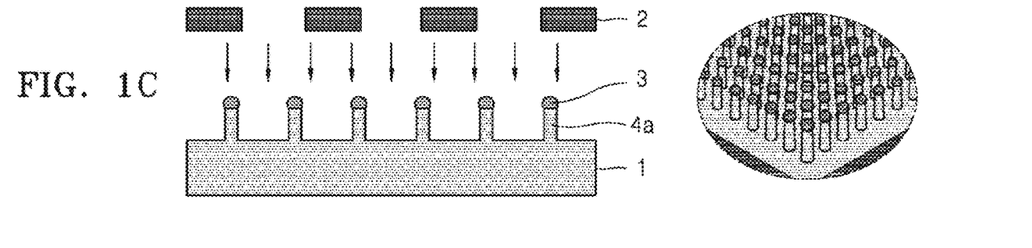
Figure 2A:
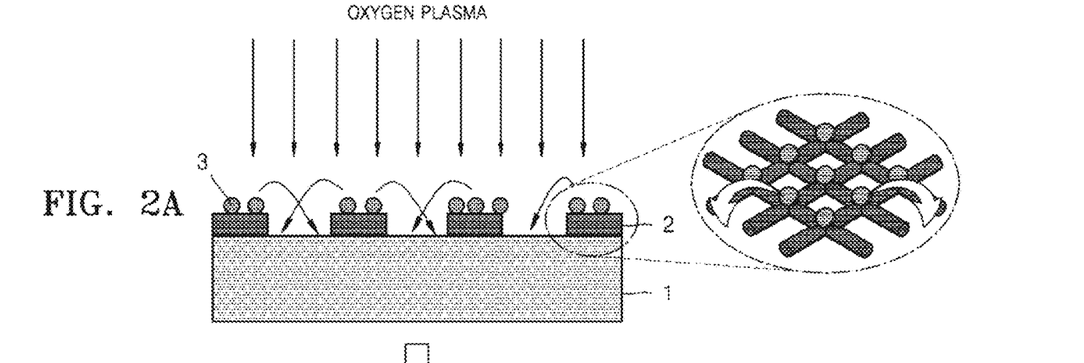
FIGS. 2A-2C illustrate a method of producing a nano composite structure according to a second embodiment.
Figure 2B:
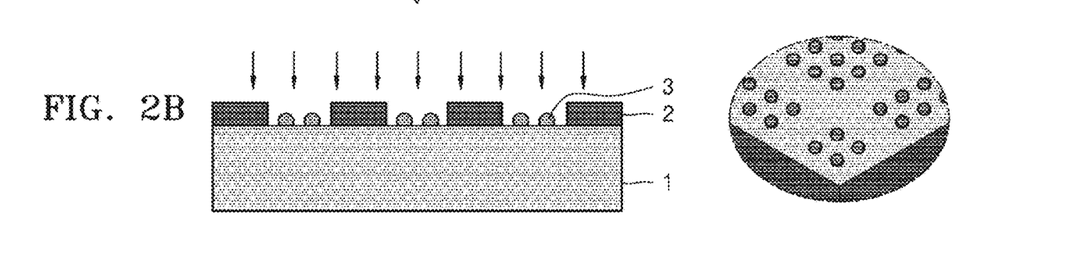
Figure 2C:
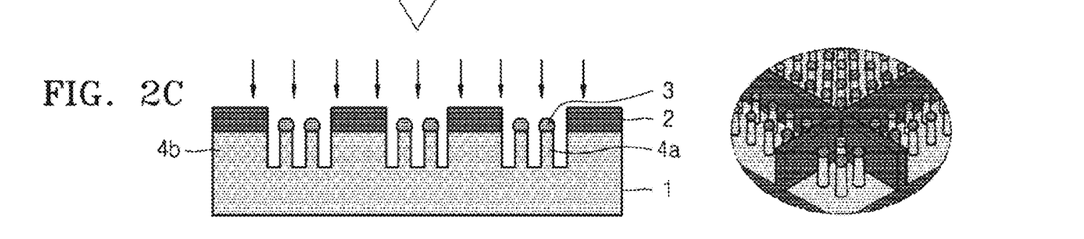

FIGS. 1A-1C illustrate a method of producing a nano composite structure according to a first embodiment. FIGS. 2A-2C illustrate a method of producing a nano composite structure according to a second embodiment.

First, a substrate 1 may include at least one selected from a plastic, a fiber, a glass, a metal, a ceramic, and a carbon-based material.

The plastic may be, but is not limited thereto, a polypropylene, polyethylene terephthalate, polystyrene, polymethyl methacrylate, polyvinylidene fluoride, polytetrafluoroethylene, a copolymer thereof, or a combination thereof.

The fiber may include a natural fiber, a synthetic fiber, or a combination thereof. The natural fiber may be, for example, cotton, linen, wool, silk, asbestos fiber, or a combination thereof. The synthetic fiber may be, for example, selected from i) a regenerated fiber, such as rayon, modal, tencel, lyocell, and polynosic; ii) a semi-synthetic fiber, such as acetate and triacetate; iii) a polyamide-based synthetic fiber, such as nylon, Nomex, Kevlar and the like; a polyolefin-based synthetic fiber, such as polyethylene, polypropylene and the like; a polyester-based synthetic fiber, such as polyethylene terephthalate and the like; acryl synthetic fiber; a poly (meth) acrylate-based synthetic fiber; polyvinyl alcohol (PVA) synthetic fiber; polyurethane synthetic fiber; polyvinylchloride (PVC) synthetic fiber; polyvinylidene chloride (PVDC) synthetic fiber; polystyrene synthetic fiber; and an inorganic fiber such as glass fiber and the like, but is not limited thereto.

The carbon-based material may be graphite, carbon fiber, diamond, graphene, or a combination thereof.

The metal may be iron (Fe), aluminum (Al), stainless steel, copper (Cu), platinum (Pt), gold (Au), silver (Ag), titanium (Ti), silicon (Si), an alloy thereof, or a combination thereof.

According to another aspect of the embodiments, a porous substrate may be used as the substrate 1. The substrate 1 may, for example, have a non-woven fabric shape, a woven fabric shape, or a net shape. When the substrate 1 is formed of fiber, the substrate 1 may have a non-woven fabric shape. When the substrate 1 is formed of a material having strength beyond a certain level, the substrate 1 may be formed into a net shape or a woven fabric shape. When the substrate 1 is formed of a net shape, the substrate 1 having the net shape may have about 10 Mesh to about 500 Mesh based on Tyler Standard Sieve. Within the mesh range, water may be passed out and only oil may be selectively retrieved. When the mesh size exceeds 500 Mesh, the size of pore of the mesh may be extremely small such that a speed at which water flowing therethrough may be substantially low, which may cause problems in oil-water separation efficiency. When the mesh size is less than 10 Mesh, the size of pore of the mesh may be extremely large such that oil may flow therethrough as well.

The substrate 1 may have a flat shape or a curved shape. When the substrate 1 has a curved shape, the nano-pattern may be formed on at least some of concave portions of the curved shape. When the substrate 1 has a curved shape, the substrate 1 may have improved retrieval efficiency because water from a mixture of water and oil may be selectively passed therethrough and only oil may be retrieved, and thus, strongly volatile oil may be collected within the curvature, such that a surface area for evaporation of oil may be reduced.

The size of the substrate 1 is not limited and a surface of the substrate 1 may be, for example, 100 $cm^2$ or greater. The substrate 1 may have a large surface area, for example, a surface area of 10 cm×10 cm or greater. A thickness of the substrate 1 is not limited.

A metal net structure 2 is not only a material for the inorganic particle 3, which will coat the surface of the oil-water separation structure, but it is also used for uniformly depositing the inorganic particle 3 of a metal or a metal oxide generated from the metal net structure 2 on the entire surface of the substrate 1 during a plasma treatment process described below. The inorganic particle 3 may act as a mask or as an inhibitor for selectively etching a portion of the substrate 1 on which the inorganic particle 3 is not deposited and thus, a nano-pattern may be formed due to the selective etching of the surface of the substrate 1. The use of the metal net structure 2 allows for a uniform deposition of the inorganic particle 3 on the entire surface of the substrate 1 and thus, the oil-water separation structure may be manufactured to have a large surface area.

The metal net structure 2 may include a metal or a metal oxide for providing suitable surface properties according to the purpose of oil-water separation. According to an embodiment, the metal net structure 2 may include a metal or a metal oxide for providing hydrophilicity or superhydrophilicity, which allows water to pass but does not allow oil to pass through the oil-water separation structure. For example, the metal net structure 2 may include at least one selected from Ti, Cu, Au, Ag, Cr, Pt, Fe, Al, Si, an alloy thereof, and an oxide thereof. For example, in the case of a metal net structure including a Ti, a $TiO_2$ particle-coated nano structure may be produced. The $TiO_2$ particle-coated nano composite structure may have a superhydrophilic surface.

The shape of the metal net structure 2 may vary according to a nano patterned structure. For example, as shown in FIGS. 1A and 2A, any mesh structure may be used as the metal net structure 2 as long as the inorganic particle 3 formed of metal or metal oxide generated from the metal net structure 2 is uniformly deposited on the entire surface of the substrate 1.

For example, the metal net structure 2 may be a metal mesh in which a metal wire is weaved into a mesh shape. The diameter and the gap between metal wires forming the metal net structure 2 are not particularly limited and may be adjusted according to a desired nano-pattern structure. For example, a gap between the metal wires forming the metal net structure 2 may be in a range of about 10 μm to about 500 μm.

The size of the metal net structure 2 may be selected to suit the size of the substrate 1 for forming the nano-pattern.

In the placing of the metal net structure 2 on the substrate 1, the metal net structure 2 may be placed in contact with the substrate 1, or may be spaced apart from the substrate 1 at a certain gap. By changing the gap between the substrate 1 and the metal net structure 2, various patterns may be formed on the substrate 1. The gap between the substrate 1 and the metal net structure 2 may be controlled to be in a range of 0 to about 20 mm.

FIGS. 1A-1C illustrate an embodiment in which the metal net structure 2 is spaced apart from the substrate 1 at a certain gap, and FIG. 2A-2C illustrates an embodiment in which the metal net structure 2 is placed in contact with the substrate 1.

Subsequently, the substrate 1 above or immediately on which the metal net structure 2 is placed is subjected to a plasma treatment.

In some embodiments, the plasma treatment includes depositing a metal or metal oxide particle generated from the metal net structure on the surface of the substrate through the plasma treatment; and etching residual portions other than portions on which the metal or metal oxide particles are deposited from the surface of the substrate through the plasma treatment.

Referring to FIGS. 1A-1C and 2A-2C, when the plasma treatment is performed, the inorganic particle 3, that is, the metal or metal oxide particle, is separated from the metal net structure 2 and deposited on the surface of the substrate 1. The inorganic particle 3 may form a cluster when the plasma treatment proceeds.

In this regard, when the metal net structure 2 is spaced apart from the substrate 1, as illustrated in FIG. 1A, the inorganic particle 3 may be formed even on a portion of the substrate immediately under the metal net structure 2, whereas when the metal net structure 2 is in contact with the substrate 1, as illustrated in FIG. 2A, the inorganic particle 3, may not be deposited on the portion of the substrate immediately under the metal net structure 2.

When the substrate 1 on which the inorganic particle 3 of the metal or metal oxide is deposited is continuously plasma treated, a portion in which the inorganic particle 3 of the metal or metal oxide is not deposited may be selectively etched to form a nano-patterned structure on the surface of the substrate 1.

Figure 3:
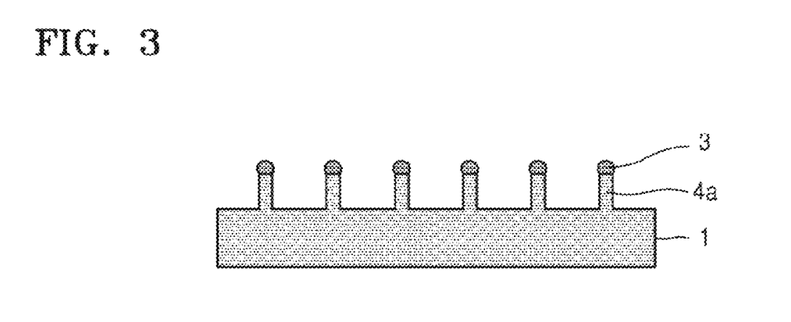
FIG. 3 is a schematic view of a nano composite structure according to a first embodiment.
Figure 4:
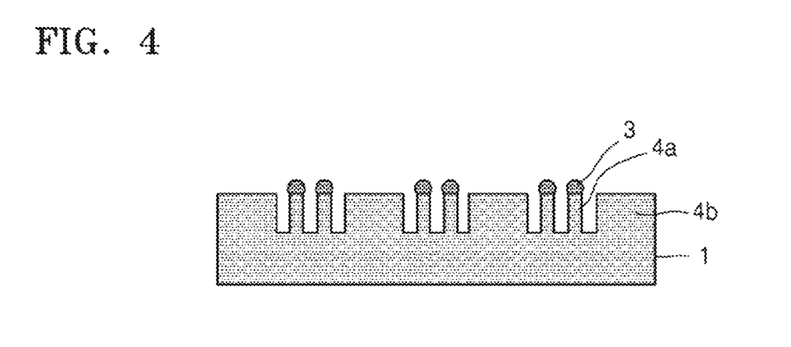
FIG. 4 is a schematic view of a nano composite structure according to a second embodiment.

In detail, a portion in which the inorganic particle 3 of the metal or metal oxide is deposited on the surface of the substrate 1 acts as an inhibitor for etching of plasma and thus, a speed of etching in that portion is substantially low. A portion in which the inorganic particle 3 of the metal or metal oxide is not deposited on the surface of the substrate 1 may be etched by plasma and thus, a speed of etching in that portion may be high. As a result, a nano-pattern formed of a first protrusion 4a having a shape of nano-hair, nano-fiber, nano-pillar, nano-rod, or nano-wire may be formed on the surface of the substrate 1. As illustrated in FIGS. 2A-2C, when the metal net structure 2 contacts the substrate 1, as described above, on the portion of the substrate 1 immediately under the metal net structure 2, the inorganic particle 3, is not deposited, and also, plasma etching does not occur. FIG. 3 is a schematic view of a nano composite structure produced by using the method illustrated in FIGS. 1A-1C. FIG. 4 is a schematic view of a nano composite structure produced by using the method illustrated in FIGS. 2A-2C.

The depositing of the inorganic particle 3, and the etching of the substrate 1 may be simultaneously performed under the same plasma treatment conditions.

As illustrated in FIGS. 1A-1C, during the etching through the plasma treatment, the metal net structure 2 may not be removed and may be continuously maintained above the substrate 1. During the etching through the plasma treatment, the inorganic particle 3 of the metal or metal oxide deposited on the substrate 1 may also be scraped off little by little due to sputtering and thus, the inorganic particle 3 that acts as an inhibitor needs to be continuously supplied during a long period of etching. Accordingly, the metal net structure 2 may not be removed and may be continuously plasma treated to continuously supply the inorganic particle 3 of the metal or metal oxide and maintain the cluster.

Various nano patterned structures may be obtained by changing a plasma treatment condition and a plasma treatment time.

For example, the plasma treatment may be performed at a voltage range of about −100 V to about −1000 V, at a pressure of about 1 to about 1000 mTorr, for about 10 seconds to about 5 hours. When the plasma treatment time increases, the surface of the substrate 1 may change from being hydrophilic to being superhydrophilic. In some embodiments, when the plasma treatment time increases, superhydrophilicity of the surface of the substrate 1 increases and a contact angle with respect to water may decrease to 20° or less, 10° or less, 5° or less, or 1° or less. Herein, hydrophilicity is defined as a case in which a contact angle of the surface of the substrate with respect to pure water is 20° or less, and superhydrophilicity is defined as a case in which a contact angle of the surface of the substrate with respect to pure water is less than 10°.

The plasma treatment may be performed in the presence of at least one gas selected from $O_2$, $CF_4$, Ar, $N_2$, and $H_2$. Among these, when $O_2$ gas is used, $O_2$ gas may bind to the surface of the substrate 1 due to the plasma treatment to provide durable hydrophilicity to the surface of the substrate 1. Meanwhile, pressure during the plasma treatment may be, for example, from about 1 mTorr to about 1000 mTorr, and a higher pressure may be used.

Figure 5:
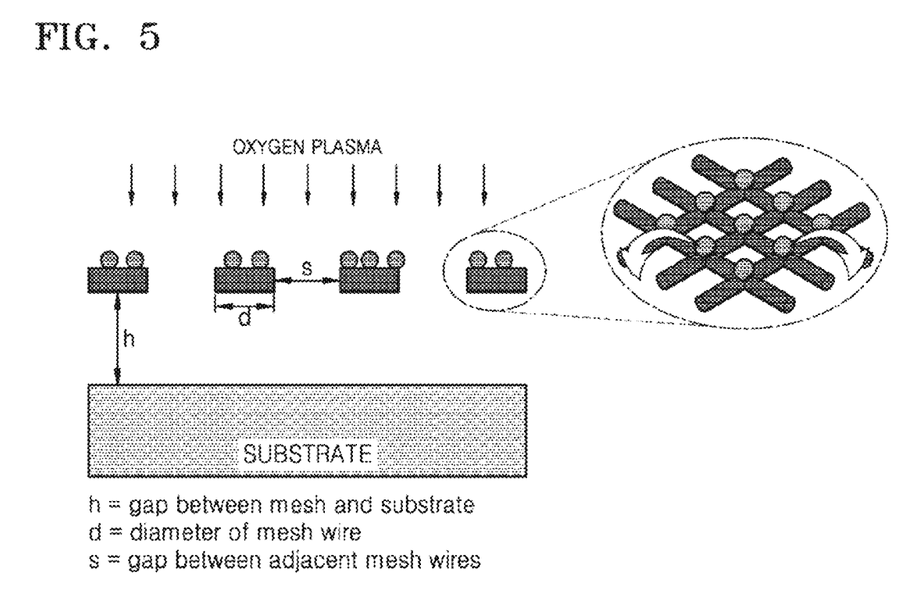
FIG. 5 illustrates a mesh used in a method of producing a nano composite structure according to an embodiment, illustrating the length of a mesh wire, a gap between adjacent mesh wires, and a distance between a mesh and a substrate.

Various patterned structures may also be obtained by controlling the gap or diameter of a wire constituting the metal net structure 2. In FIG. 5 illustrating an embodiment of a method of producing a nano composite structure, "h" indicates a gap between a mesh formed of metal or metal oxide and a substrate, "d" indicates a diameter of a mesh wire, and "s" indicates a gap between adjacent mesh wires. Various patterned structures may be obtained by controlling these elements.

In some embodiments, the method of producing the nano composite structure may further include, providing a hydrophobic surface characteristic to the nano composite structure, removing the metal net structure and forming a hydrophobic thin film on the surface of the substrate after the plasma-treatment treating.

The hydrophobic thin film may include a fluorine thin film, a fluorine-containing carbonaceous thin film, an organic hydrogenation silicon thin film, or a combination thereof. For example, the hydrophobic thin film may include hexamethyldisiloxane.

In some embodiments, as the plasma treatment time increases, hydrophobicity of the surface of the substrate with the hydrophobic thin film thereon may be enhanced.

As described above, in the method of producing a nano composite structure, according to the purpose of the nano composite structure, the surface of the nano composite structure may be easily controlled to be hydrophilic, superhydrophilic or hydrophobic.

Hereinafter, a nano composite structure that is produced by using the method will be described.

A nano composite structure according to an embodiment includes a substrate including a plurality of first protrusions forming a nano pattern on at least one surface; and an inorganic particle disposed at an end of at least some portions of the first protrusions.

As described above, the term "nano composite structure" as used herein refers to a structure that includes a substrate having a nano patterned structure on its surface and an inorganic material formed of metal or metal oxide, which may be different from a material for the substrate, is disposed at an end of a protrusion forming the nano patterned structure. Accordingly, the term "nano composite structure" may include a "nano" structure and a "composite material."

A nano pattern of the nano composite structure on the surface of the substrate may vary according to a process condition of the preparation method. The kind and shape of the substrate have been described above when a method of producing a nano composite structure according to an embodiment is also explained above.

In some embodiments, the first protrusions that form the nano pattern may each have a diameter of about 1 to about 100 nm, a length of about 1 to about 10,000 nm, and an aspect ratio of about 1 to about 100. Each of the first protrusions may have a nano-hair shape, a nano fiber shape, a nano-pillar shape, a nano-rod shape, or a nano-wire shape.

An inorganic particle may be disposed at an end of at least a portion of the first protrusions. The inorganic particle may include a metal or metal oxide which provides a surface characteristic that is suitable for a purpose of the nano composite structure. The metal or metal oxide is originated from a metal net structure used in the preparation process. For example, the inorganic particle may include Ti, Cu, Au, Ag, Cr, Pt, Fe, Al, Si, an alloy thereof, an oxide thereof, or a combination thereof. In an embodiment, when an inorganic particle including $TiO_2$ is placed on an end of a first protrusion that constitutes the nano pattern, the surface of the nano composite structure that once had hydrophilicity may have superhydrophilicity.

In some embodiments, the inorganic particle formed of metal or metal oxide derived from a metal net structure may be placed on ends of almost all or all first protrusions. However, since some inorganic particles may be removed by the etching of the plasma treatment, the inorganic particle may be disposed on only some first protrusions.

FIG. 3 is a schematic sectional view of a nano composite structure according to a first embodiment. The nano composite structure may be produced according to the embodiment of the method of producing a nano composite structure illustrated in FIG. 1. As illustrated in FIG. 3, a plurality of first protrusions 4a may be repeatedly arranged at uniform gaps, constituting a uniform nano pattern on the entire surface of the substrate 1.

FIG. 4 is a schematic sectional view of a nano composite structure according to a second embodiment. The nano composite structure may be produced according to the embodiment of the method of producing a nano composite structure illustrated in FIGS. 2A-2C. Referring to FIG. 4, since the surface of the substrate 1 in contact with a metal net structure in the preparation process is not etched by the plasma treatment, a second protrusion 4b that does not constitute a nano pattern may exist. The inorganic particle 3 is not disposed at an end of the second protrusion 4b. The second protrusion 4b may be substantially the same as the pattern of the metal net structure in contact with the substrate 1. The second protrusion 4b may have a mesh pattern.

In some embodiments, the nano composite structure may further include a hydrophobic thin film coated on at least a portion of the surface of the substrate. The hydrophobic thin film may include a fluorine thin film, a fluorine-containing carbonaceous thin film, an organic hydrogenation silicon thin film, or a combination thereof. For example, the hydrophobic thin film may include hexamethyldisiloxane.

The nano composite structure may be used as a material for oil-water separation. For example, the nano composite structure may be used as a material for liquid-liquid separation. For example, the nano composite structure may be used as a material for an oil retrieving apparatus, a filter, or an oil fence, which are used during oil leakage in the sea, a material for an intank filter or spin-on filter for a transportation means, such as a vehicle, or a material for diaphragm for the electric or electronic industry. Furthermore, the nano composite structure may be also be used as a material for gas-liquid separation, for example, a material for various industrial filters including an aerosol separation material for industrial machine and a material for air cleaning.

In some embodiments, the nano composite structure may be used in a cladding material for construction (vinyl siding, wall panel, glass window, plastic sheet, and the like), a tarpaulin (film structure, awning, a tent, and the like), an advertisement material, such as a sign board, a safety material (a road sign, a median strip, a reflection sheet for license plate for a vehicle, and the like), a non-dripped material (a non-dripped film for greenhouse, a food wrapper, and the like), an anti-fogging material (a bathroom glass, a building glass, a vehicle glass, and the like), a vehicle cladding (a side mirror, painting of vehicle body, and the like), and the like.

Hereinafter, embodiments will be further described by referring to Examples.

A morphology structure of the surface of the nano composite structure produced according to Example and Comparative Example was analyzed by scanning electron microscopy (SEM, Hitachi Inc., S-4000, Japan). A contact angle (CA) with respect to water was measured by using a contact angle meter (Phoenix, SEO Co. Ltd.). Water droplets used in measuring a static contact angle each had a volume of 5 µl. An average of five CA values measured at 5 different positions was defined as an average CA value.

Example 1

As a substrate, a circular substrate formed of polyethylene terephthalate (manufacturer: SK Chemical) having a diameter of 160 mm and a thickness of 1 mm was used.

As a metal mesh, a stainless steel mesh (Nilaco Co., Ltd, diameter: 160 mm, wire gap: 320 µm, wire diameter: 180 µm) was used, and as an apparatus for plasma treatment, a radio-frequency generator (manufacturer: Advanced Energy, model name: RTX-600) was used.

First, the substrate was placed on a cathode in a chamber of a plasma treatment apparatus. A stainless steel mesh was arranged to be spaced apart from the substrate with a gap of 2 mm. To fix the stainless steel mesh, a support was mounted on the stainless steel mesh along an edge thereof, and then, the resultant structure was mounted on the substrate, thereby spatially separating the support from the stainless steel mesh. Then, a plasma treatment was performed at a voltage of −400 V, in a pressure of 50 mTorr, at $O_2$ gas fraction of 20 sccm for 60 minutes, thereby completing the preparation of a nano composite structure.

Example 2

A nano composite structure was produced by a plasma treatment in the same manner as in Example 1, except that the stainless steel mesh was brought into contact with the surface of the substrate such that the gap (h) between the stainless steel mesh and the substrate was 0 mm.

Comparative Example 1

A nano composite structure was produced by performing a plasma treatment on the substrate in the same manner as in Example 1, except that the stainless steel mesh was not used.

Evaluation Example 1

Surface Pattern and Component Analysis

Figure 6:
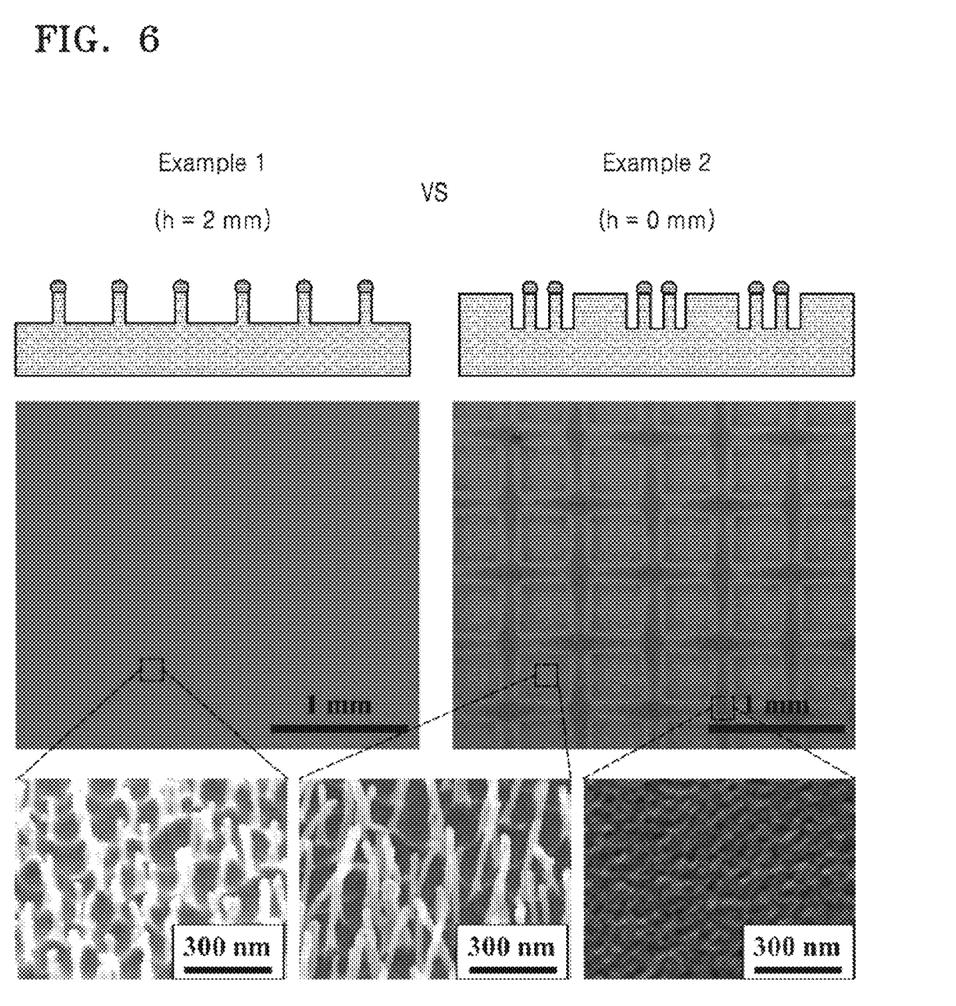
FIG. 6 shows a scanning electron microscopic (SEM) image of nano composite structures produced according to Examples 1 and 2 comparing the surfaces of the nano composite structures.

Surface patterns of the nano composite structures produced according to Examples 1 and 2 were identified by scanning electron microscope (SEM), and the result is shown in FIG. 6. Referring to FIG. 6, in the case of Example 1, a uniform nano pattern was formed on the entire surface of the substrate, and in the case of Example 2, a nano pattern was not formed on a portion of the surface of the substrate that had contacted the stainless steel mesh, and a portion of the stainless steel mesh that was not etched into a nano pattern remained intact.

Figure 7A:
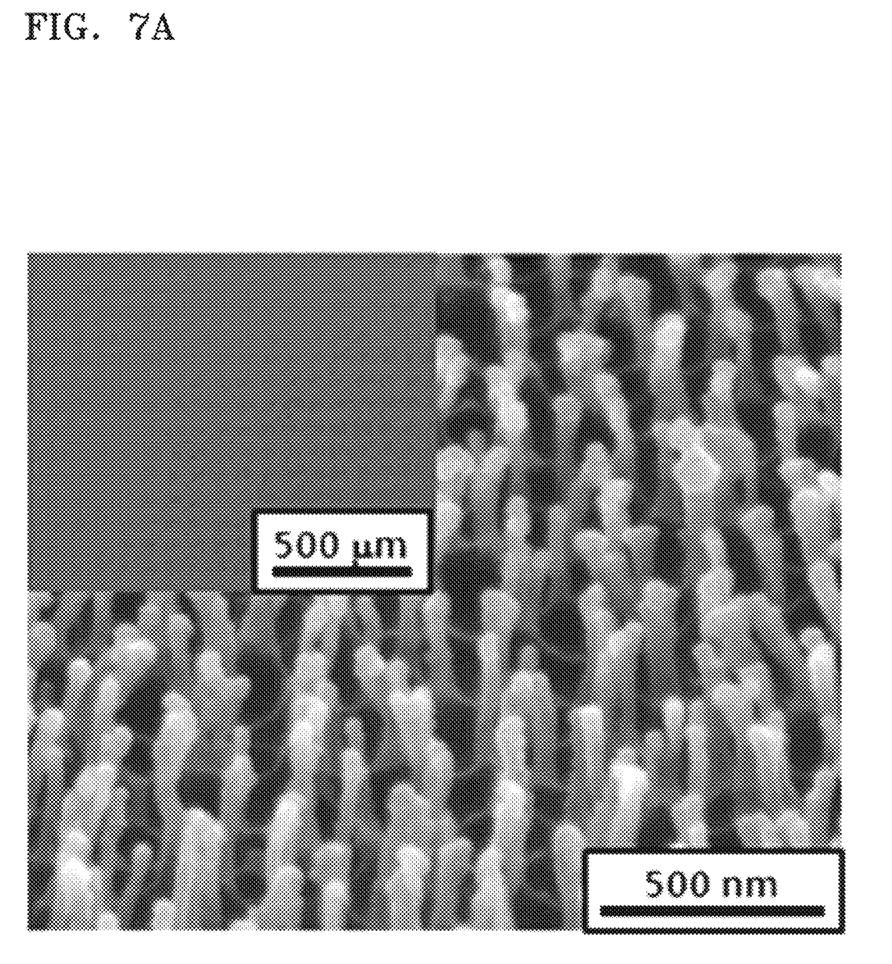
FIG. 7A shows a SEM image of a nano composite structure produced according to Example 1.
Figure 7B:
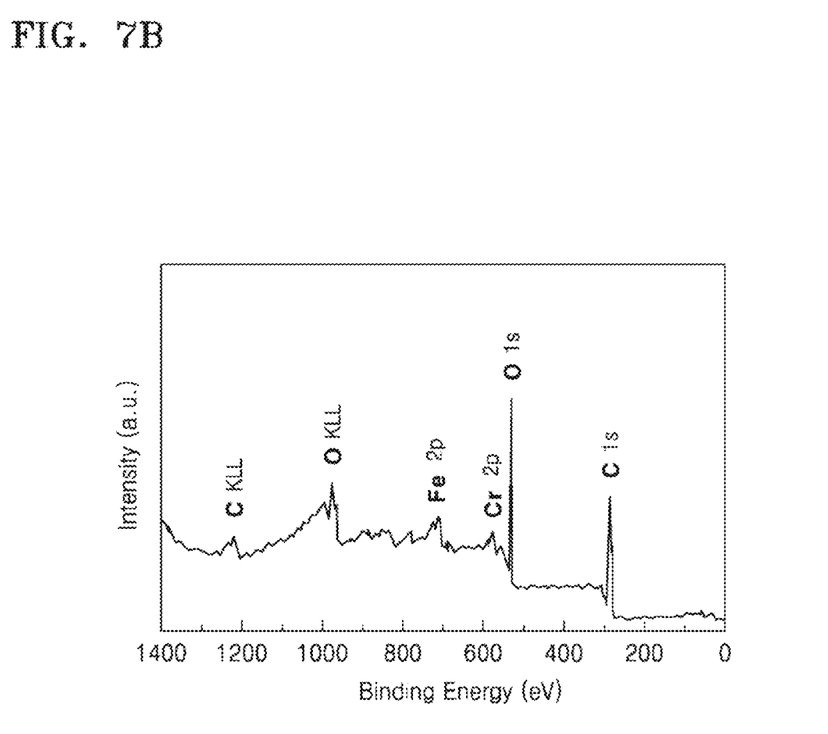
FIG. 7B shows X-ray photoelectron spectroscopy (XPS) analysis results of components constituting a surface of the nano patterned structure produced according to Example 1.

The nano composite structure of Example 1 was analyzed by SEM, and components of the surface of the nano composite structure was analyzed by X-ray photoelectron spectroscopy (XPS), and the results are shown in FIGS. 7A and 7B, respectively. The nano composite structure of Comparative Example 1 was analyzed by SEM, and components of the surface of the nano composite structure was analyzed by XPS, and the results are shown in FIGS. 8A and 8B, respectively.

Figure 8A:
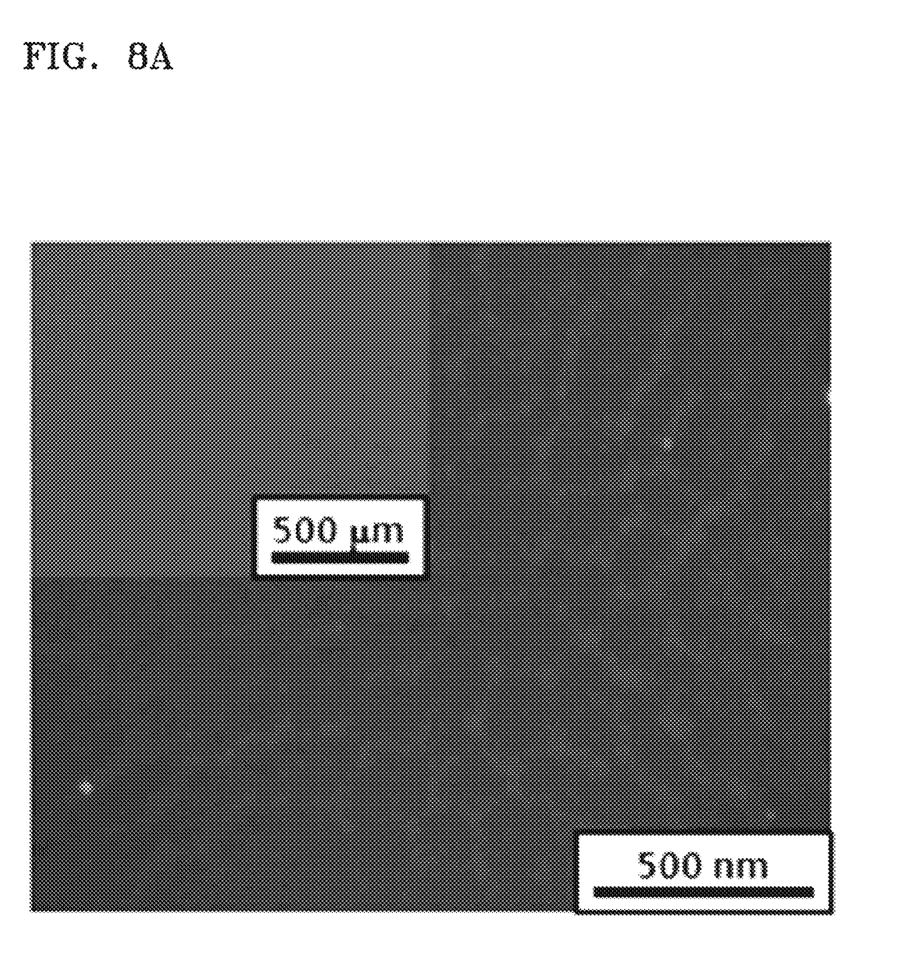
FIG. 8A shows a SEM image of a nano composite structure produced according to Comparative Example 1.

Referring to FIGS. 7A and 8A, in the case of the nano composite structure of Example 1 produced by performing a plasma treatment by using a metal mesh, a nano pattern was uniformly formed on the surface of the nano composite structure. In the case of the nano composite structure of Comparative Example 1 produced by performing a plasma treatment without a metal mesh, a nano pattern was not appropriately formed.

Figure 8B:
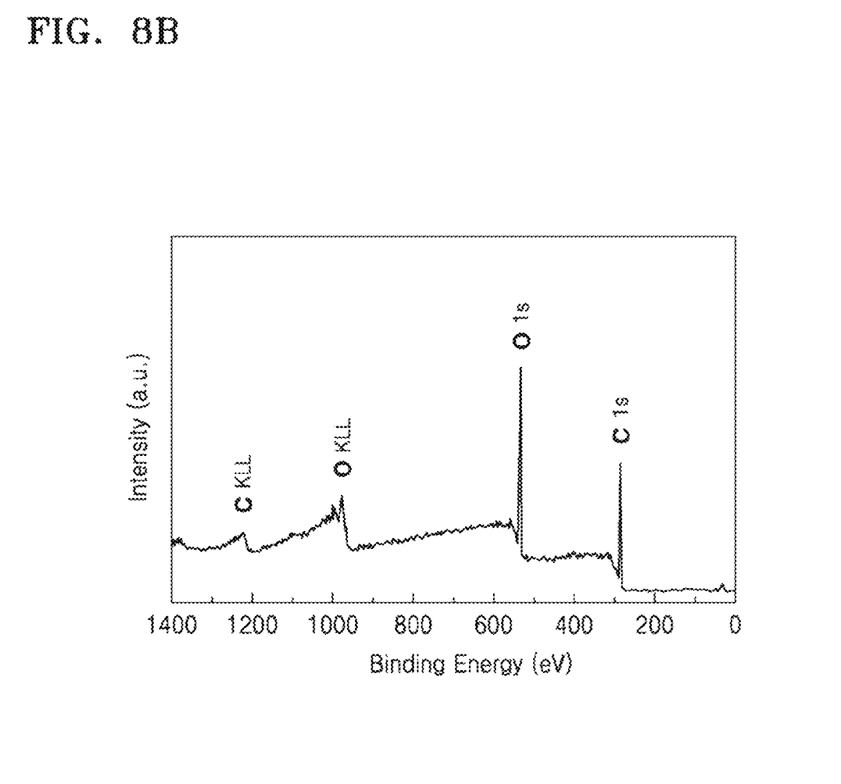
FIG. 8B shows XPS analysis results of components constituting a surface of the nano composite structure produced according to Comparative Example 1.

Referring to FIGS. 7B and 8B, XPS surface analysis results show that when the stainless steel mesh was used, Fe and Cr, which are major components of stainless steel, were distributed on the surface of a substrate to form a nano composite structure. On the other hand, when the stainless steel mesh was not used, metal elements were not present on the surface of the substrate.

Examples 3 to 5

Nano composite structures were produced in the same manner as in Example 1, except that a plasma treatment time was 5 minutes, 10 minutes, 30 minutes, and 60 minutes respectively.

To provide hydrophobicity characteristics to the nano composite structures, a hydrophobic thin film was coated on each of the nano composite structures in the same chamber immediately after the nano composite structures were formed. The coating with the hydrophobic thin film was performed such that plasma-enhanced chemical vapor deposition (ECVD) was performed using hexamethyldisiloxane (HMDSO) gas at a pressure of 10 mtorr, at a voltage of −400 V, for 15 seconds.

Evaluation Example 2

Surface Characteristics Evaluation

Figure 9:
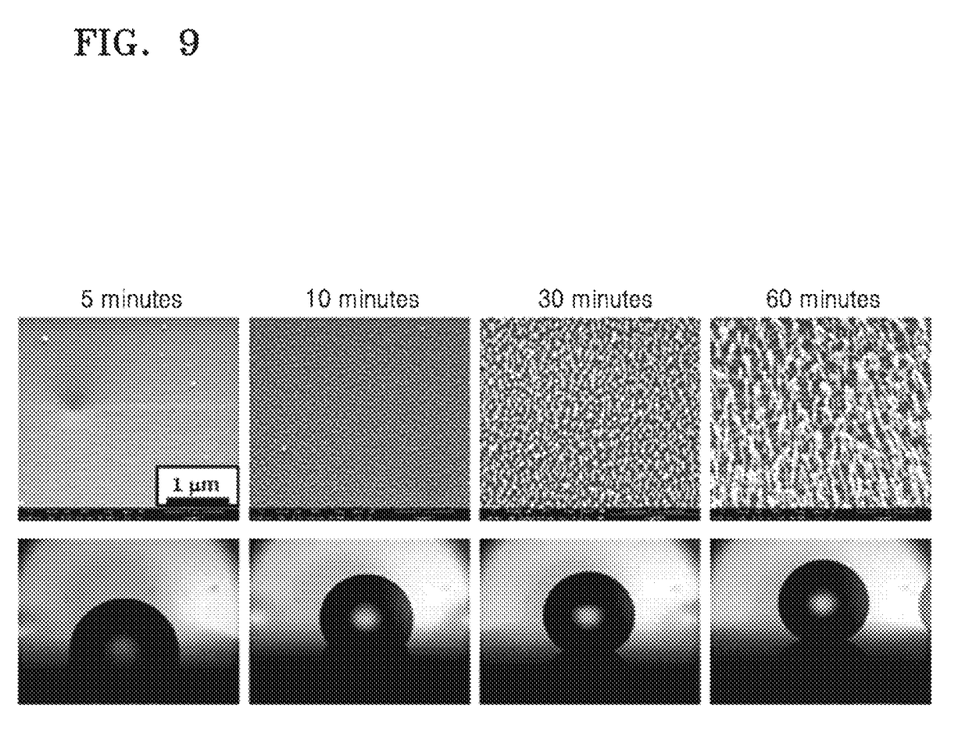
FIG. 9 shows SEM images of nano composite structures produced according to Examples 3 to 5 and optical images showing a contact angle of the nano composite structures with respect to water after coating with a hydrophobic thin film.

FIG. 9 shows SEM images of the nano composite structures of Examples 3 to 5 and images of water droplets to explain a contact angle. All samples had been coated with a hydrophobic thin film immediately after $O_2$ plasma surface treatment.

Referring to FIG. 9, as the $O_2$ plasma treatment time increases, the length of a nano-sized protrusion in the nano composite structure increases and thus a nano pattern was well formed.

When the plasma treatment time was 5 minutes, 10 minutes, 30 minutes, and 60 minutes, a contact angle with respect to water was 95°, 145°, 155°, and 160°, respectively. It was also confirmed that as the $O_2$ plasma treatment time increased, hydrophobicity of the surface of the substrate on which the hydrophobic thin film was coated was enhanced.

Figure 10:
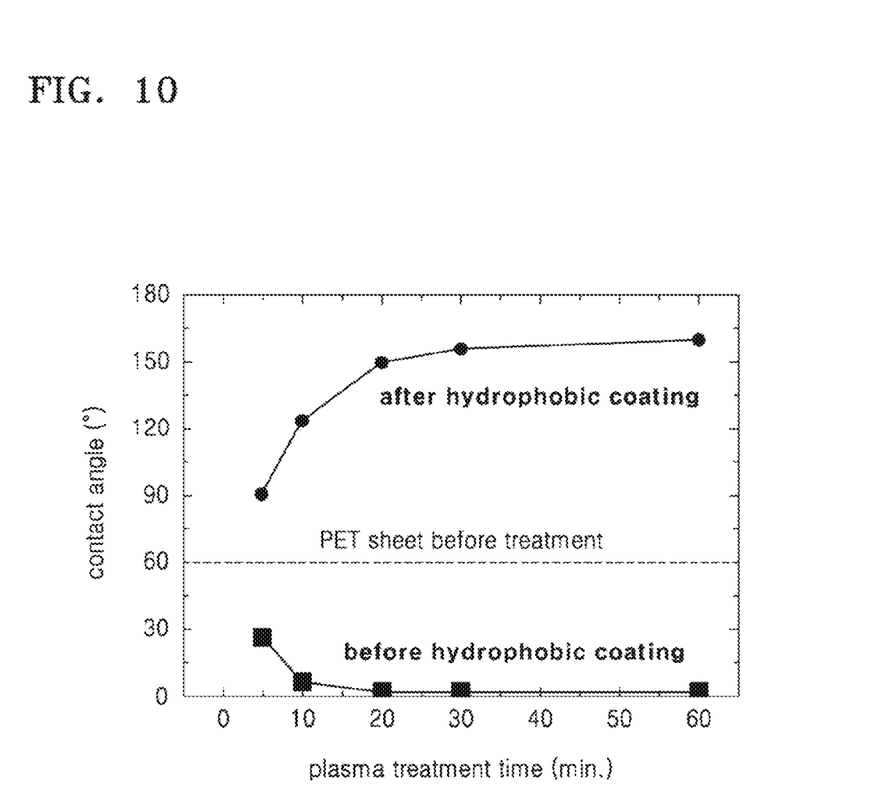
FIG. 10 shows a graph of a contact angle with respect to water on surfaces of the nano composite structures produced according to Examples 3 to 5 before or after the coating with a hydrophobic thin film.

A contact angle of the surface of the substrate with respect to water according to the oxygen plasma treatment time was measured before and after the coating with a hydrophobic thin film, and results thereof are shown in FIG. 10. In the case of the nano composite structure on which the hydrophobic thin film was not coated after the oxygen plasma treatment, a contact angle of the surface of the substrate with respect to water was rapidly decreased, and even when the plasma treatment time was 10 minutes or more, the contact angle was less than 10°. That is, a superhydrophilic surface was obtained. On the other hand, when the oxygen plasma treatment was performed and then a hydrophobic thin film was coated, a result similar to that explained in connection with FIG. 10 was obtained. In detail, when the oxygen plasma treatment time was at least 20 minutes, the contact angle with respect to water was 150°. That is, a superhydrophobic surface was obtained.

According to an embodiment, a nano composite structure having a uniform nano patterned structure may be obtained by using a metal mesh structure.

According to another embodiment, an inorganic particle to be deposited and plasma gas are controlled, and due to the coating with a hydrophobic thin film, surface characteristics of the nano composite structure may be controlled to have hydrophilicity, superhydrophilicity, or superhydrophobicity.

By using a method of producing a nano composite structure according to an embodiment, a nano composite structure with a nano patterned structure on its overall surface may be easily produced. The nano composite structure may have superhydrophilic or superhydrophobic surface characteristics.

While aspects of the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nano composite structure comprising:
a substrate having a curved surface;
a plurality of first protrusions forming a nano pattern on a concave portion of the curved surface of the substrate; and
an inorganic particle disposed only at a distal end of each of the first protrusions,
wherein the inorganic particle includes a metal or a metal oxide that has a superhydrophilic property,
wherein the concave portion has a curvature configured to collect oil within the curvature,
wherein the plurality of first protrusions is formed by plasma-etching a portion, in which the inorganic particles are not deposited, of the concave portion of the curved surface of the substrate, wherein a longitudinal direction of each of the first protrusions on the concave portion is parallel to a direction of the plasma-etching; and wherein at least two of the first protrusions are parallel and adjacent each other.

2. The nano composite structure of claim 1, wherein the substrate comprises a non-woven fabric.

3. The nano composite structure of claim 1, wherein each of the first protrusions has a nano-hair shape, a nano fiber shape, a nano-pillar shape, a nano-rod shape, or a nano-wire shape.

4. The nano composite structure of claim 1, wherein each of the first protrusions has a diameter of about 1 to about 100 nm, a length of about 1 to about 10,000 nm, and an aspect ratio of about 1 to about 100.

5. The nano composite structure of claim 1, wherein the nano pattern is repeatedly arranged at identical or different gaps.

6. The nano composite structure of claim 1, wherein the substrate further comprises a plurality of second protrusions.

7. The nano composite structure of claim 1, wherein the substrate further comprises a plurality of second protrusions which do not have inorganic particles disposed at ends of the plurality of the second protrusions.

8. The nano composite structure of claim 6, wherein the plurality of second protrusion is formed in a mesh pattern.

9. The nano composite structure of claim 6, wherein a height of the second protrusion is equal to or higher than a height of the first protrusion.

10. The nano composite structure of claim 1, further comprising a hydrophobic thin film coated on at least a portion of the surface of the substrate.

11. The nano composite structure of claim 10, wherein the hydrophobic thin film comprises a fluorine thin film, a fluorine-containing carbonaceous thin film, an organic hydrogenation silicon thin film, or a combination thereof.

12. The nano composite structure of claim 10, wherein the hydrophobic thin film comprises hexamethyldisiloxane.

13. A nano composite structure comprising:
a substrate having a curved surface;
a plurality of first protrusions forming a nano pattern on a first portion of a concave portion of the curved surface of the substrate; and
a plurality of second protrusions formed in a mesh pattern on a second portion of the surface of the substrate,
wherein an inorganic particle is disposed only at a distal end of each of the plurality of first protrusions, the inorganic particle includes a metal or a metal oxide that has a superhydrophilic property, and the nano pattern is repeatedly formed in between the mesh pattern,
wherein the plurality of the first protrusions and the plurality of second protrusions are formed by plasma-etching the surface of the substrate,
wherein a longitudinal direction of each of the first protrusions on the concave portion is parallel to a direction of the plasma-etching, and wherein at least two of the adjacent first protrusions are parallel to each other; and
wherein the concave portion has a curvature configured to collect oil within the curvature.

14. The nano composite structure of claim 1, wherein a surface of the nano composite structure has hydrophilicity.

15. The nano composite structure of claim 1, wherein the substrate comprises a natural fiber, a synthetic fiber, or a combination thereof.

16. The nano composite structure of claim 1, wherein $O_2$ is bound to the surface of the substrate.

17. The nano composite structure of claim 13, wherein the concave portion of the curved surface does not block a virtual extension of any of the first protrusions in a direction from a point where the substrate and the first protrusion meet to the distal end of the first protrusion.

18. The nano composite structure of claim 13, wherein the nano pattern and the mesh pattern are formed by plasma-etching the curved surface of the substrate,
wherein the longitudinal direction of each of the first protrusions on the concave portion is parallel to a vertical extending direction of a side wall of the mesh pattern on the curved surface.

* * * * *